(12) United States Patent
Golov et al.

(10) Patent No.: US 9,274,175 B2
(45) Date of Patent: Mar. 1, 2016

(54) METHOD AND APPARATUS FOR TESTING A DEVICE-UNDER-TEST

(75) Inventors: Gil Golov, Backnang (DE); Thomas Henkel, Böblingen (DE); Ronald Larson, Fort Collins, CO (US); Ulrich Knoch, Herrenberg (DE)

(73) Assignee: ADVANTEST CORPORATION, Tokyo (JP)

( * ) Notice: Subject to any disclaimer, the term of this patent is extended or adjusted under 35 U.S.C. 154(b) by 755 days.

(21) Appl. No.: 13/574,573

(22) PCT Filed: Jan. 20, 2010

(86) PCT No.: PCT/EP2010/050641
§ 371 (c)(1),
(2), (4) Date: Oct. 19, 2012

(87) PCT Pub. No.: WO2011/088893
PCT Pub. Date: Jul. 28, 2011

(65) Prior Publication Data
US 2013/0193993 A1  Aug. 1, 2013

(51) Int. Cl.
*G01R 31/319* (2006.01)

(52) U.S. Cl.
CPC ........ *G01R 31/319* (2013.01); *G01R 31/31907* (2013.01)

(58) Field of Classification Search
None
See application file for complete search history.

(56) References Cited

U.S. PATENT DOCUMENTS

| | | | |
|---|---|---|---|
| 4,994,732 A * | 2/1991 | Jeffrey et al. | 324/73.1 |
| 7,065,693 B2 * | 6/2006 | Konuk | 714/738 |
| 2003/0086376 A1 * | 5/2003 | Iorga | 370/241 |
| 2004/0225459 A1 * | 11/2004 | Krishnaswamy et al. | 702/57 |
| 2005/0075821 A1 * | 4/2005 | Thalmann | 702/120 |
| 2005/0182588 A1 * | 8/2005 | Chenoweth et al. | 702/118 |
| 2005/0193303 A1 * | 9/2005 | Konuk | 714/738 |
| 2010/0153052 A1 * | 6/2010 | Schmitz | 702/117 |
| 2014/0103907 A1 * | 4/2014 | Muecke et al. | 324/130 |

* cited by examiner

Primary Examiner — Jermele M Hollington

(57) ABSTRACT

A method for testing a device-under-test includes receiving, from at least one test channel circuit dedicated to communicate with an input/output pin of the device-under-test by means of at least one hardware resource, at least one logical control command describing a desired operation of the at least one hardware resource, and converting, by means of a resource controller, the at least one logical control command into at least one dedicated control command for the at least one hardware resource, wherein the at least one dedicated control command is adapted to be received by a physical implementation of the at least one hardware resource.

17 Claims, 10 Drawing Sheets

METHOD AND APPARATUS FOR TESTING A DEVICE-UNDER-TEST

CROSS-REFERENCES TO RELATED APPLICATIONS

This application is a Continuation of and claims priority to International Application No. PCT/EP2010/050641, filed on Jan. 20, 2010, titled "METHOD AND APPARATUS FOR TESTING A DEVICE-UNDER-TEST," by Golov, et al., which is herein incorporated by reference.

TECHNICAL FIELD

Embodiments of the present invention relate to testing integrated circuits and semiconductor devices. In particular, embodiments of the present invention relate to testing integrated circuits and semiconductor devices by means of automated test equipment.

BACKGROUND

During typical semiconductor manufacturing processes, integrated circuits (ICs) may be tested to ensure their proper operation. Automated test equipment (ATE) may perform tests to ensure functionality and quality, with the ICs being devices-under-test (DUTs). In general, a test to be performed on a DUT consists of a set of digital pattern vectors that translate to stimulus voltage levels to be applied to input signal pins of the DUT according to a pre-specified timing. Signals captured from output signal pins of the DUT are translated into corresponding response vectors that may be analyzed to determine whether the DUT is operating according to its specification. An ATE generally provides a number of signal generating resources that may generate configurable signal levels with configurable timing(s). The tester may also provide signal processing resources capable of converting signals generated by the DUT (e.g. in analog form) into a format (e.g. in digital form) readable by the tester. The signal processing resources may also be configurable. The ATE may be configured, for example, by way of a set of relays, to electrically connect any tester resource to any tester interface pin.

A typical automated tester for integrated circuits includes a set of so-called test channels, each connected to a separate pin of an IC or DUT 130. This is schematically illustrated in FIG. 1A. FIG. 1A illustrates an ATE 100 for testing a DUT 130. The ATE 100 comprises a plurality of test channels 110-1, 110-2 to 110-n. Each of the test channels 110 is coupled to a central test control unit 120, such as, a computer or microcontroller. On the DUT-end, each of the test channels 110-1, 110-2 to 110-n is dedicated to a different input and/or output (I/O) pin of the DUT 130. Each test channel 110-1, 110-2 to 110-n may be divided into a digital and an analog signal processing part. Within the digital processing part, each test channel 110-1, 110-2 to 110-n comprises a channel-specific channel control block 111 coupled to the central test control unit 120, wherein the channel control block 111 again controls further digital test channel blocks, such as a digital test pattern generator 112 for generating digital pattern vectors, a test pattern comparator 113 for analyzing response vectors and a time formatting block 114 to generate pre-specified timings. Together, the blocks 111, 112, 113 and 114 make up a so-called digital test channel. The channel control block 111 conventionally also controls analog signal processing blocks or hardware resources 115, 116 coupled in between an I/O pin of the DUT 130 and the digital test channel. The hardware resources 115, 116 are adapted to connect the digital test channel to the DUT 130. The hardware resources 115, 116 are also adapted to convert a signal or a test pattern to/from the DUT 130 into a signal suited for the DUT-pin or the digital test channel. Hence, the hardware resources 115, 116 may comprise switches, relays, signal level drivers, threshold comparators, analog-to-digital converters (ADCs) and/or digital-to-analog converters (DACs), etc.

Conventionally, the digital test channels may be arranged in a separate digital test channel IC, while the hardware resources 115, 116 may be kept external to the digital test channel IC in order to ease their substitution, respectively. As illustrated in FIG. 1B, each of the test channels 110-1, 110-2 to 110-n may be divided into a digital test channel part 140-1, 140-2, . . . , 140-n and an analog test channel part 150-1, 150-2, . . . , 150-n, respectively. The digital test channel parts 140-1, 140-2, . . . , 140-n of the test channels 110-1, 110-2, . . . , 110-n (e.g., blocks 111, 112, 113 and 114, respectively), may be placed into a dedicated test pattern processing IC 140. The analog test channel parts 150-1, 150-2, . . . , 150-n (e.g., hardware resources 115, 116, respectively), may be located externally from the test pattern processing IC 140, in between the DUT 130 and the pattern processing IC 140.

As discussed above, the dedicated pattern processing IC 140 may be responsible for generating digital patterns that translate, via the hardware resources 150, to stimulus voltage levels to be applied to a plurality of input signal pins of the DUT 130 according to a pre-specified timing. Signals captured from a plurality of output signal pins of the DUT 130 via the hardware resources 150 may be translated into corresponding response vectors that may again be analyzed by the dedicated pattern processing IC 140. For this reason, such a chip 140 typically has a plurality of digital test channels 140-1, 140-2, . . . , 140-n. In addition, external hardware components or resources 150-1, 150-2, . . . , 150-n are needed, e.g., relays 116, or signal drivers 115, that can drive various voltages. Also, ADCs, DACs and many other hardware resources may be applied.

Traditionally, each digital test channel part 140-1, 140-2, . . . , 140-n in the pattern processing or test channel IC 140 controls its associated analog hardware resources 150-1, 150-2, . . . , 150-n, respectively. Such a setup may create great difficulties when the external resources 150-1, 150-2, . . . , 150-n are replaced for any reason with other components or resources that behave differently. Normally, the test channel IC 140 would have to be adapted in this case. However, modifying the test channel IC 140 may be an expensive and time consuming process. Also, the test software running on the central test control unit 120 may have to be adapted in case of such modifications.

SUMMARY OF THE INVENTION

Embodiments of this present invention provide solutions to the challenges inherent in test hardware resource management. In a method according to one embodiment of the present invention, a method for integrating the use of hardware testing resources for more than one channel is disclosed. In one embodiment, with a plurality of test channel integrated circuits, different logical control commands from different test channel integrated circuits may be temporally scheduled such that the different test channel integrated circuits may subsequently access a single hardware resource in a multiplexing scheme, such as time division multiplexing.

In an apparatus according to one embodiment of the present invention, an apparatus for testing a device-under-test may comprise a test channel integrated circuit operable to communicate with an input or output pin of the device-under-test by means of a hardware resource. A resource controller is also coupled to the test channel integrated circuit to receive a logical control command describing a desired operation of the hardware resource. The resource controller is operable to convert the logical control command into a dedicated control command for the hardware resource. The dedicated control command is adapted to a physical implementation of the hardware resource.

In a method according to one embodiment of the present invention, a method for testing a device-under-test may comprise a step for receiving, from a test channel integrated circuit dedicated to communicate with an input or output pin of the device-under-test by means of a hardware resource, a logical control command describing a desired operation of the hardware resource. The logical control command may also be converted into a dedicated control command for the hardware resource. The dedicated control command is adapted to a physical implementation of the hardware resource.

In an apparatus according to one embodiment of the present invention, an apparatus may provide for testing a DUT, the apparatus comprising a test channel integrated circuit adapted to communicate with an input or output pin of the device-under-test by means of a hardware resource. Further, the apparatus comprises a resource control means coupled to the test channel integrated circuit for receiving a logical control command describing a desired operation of the hardware resource. The resource control means is adapted to convert the logical control command into a dedicated control command for the hardware resource. The dedicated control command is adapted to a physical implementation of the hardware resource. The logical control command received from the test channel integrated circuit is adapted to the hardware resource genus or species; however, it is kept independent from an actual physical implementation of the hardware resource.

In an apparatus according to one embodiment of the present invention, an apparatus may comprise a plurality of test channel integrated circuits. The shared resource control means may be operable to temporally schedule different logical control commands from different test channel integrated circuits, such that the different test channel integrated circuits may subsequently access a single hardware resource in a multiplexing scheme, such as, e.g., time division multiplexing (TDM).

In an apparatus according to one embodiment of the present invention, an apparatus may comprise a (shared) resource control means that may be re-configurable through reprogramming, for adapting the resource control means to a varying or changing physical implementation of physically connected hardware resources. In other words, the (shared) resource control means may be reconfigured to at least one new external resource when the at least one external resource is replaced for any reason with other components or resources that behave differently.

Embodiments of the present invention allow an emulation of hardware resource control protocols while keeping logical channel control commands for controlling the hardware resources uniformed to a respective hardware resource genus (species), but independent of the actual physical implementation of the connected hardware resource. This means, for example, that if an ADC resource is replaced by another ADC resource, the logical channel control commands delivered from the test channel integrated circuit to the resource control means are still valid for the new, replaced ADC resource. Hence, channel resources may be changed without changing a channel control algorithm running on a central test control unit and/or a channel-specific channel control block. When changing a channel hardware resource, only a respective translation-scheme from the logical control command to the dedicated control command has to be adapted to the new channel resource.

BRIEF DESCRIPTION OF THE DRAWINGS

Embodiments of the present invention will be better understood from the following detailed description, taken in conjunction with the accompanying drawing figures in which like reference characters designate like elements and in which.

DETAILED DESCRIPTION

Figure 1A:
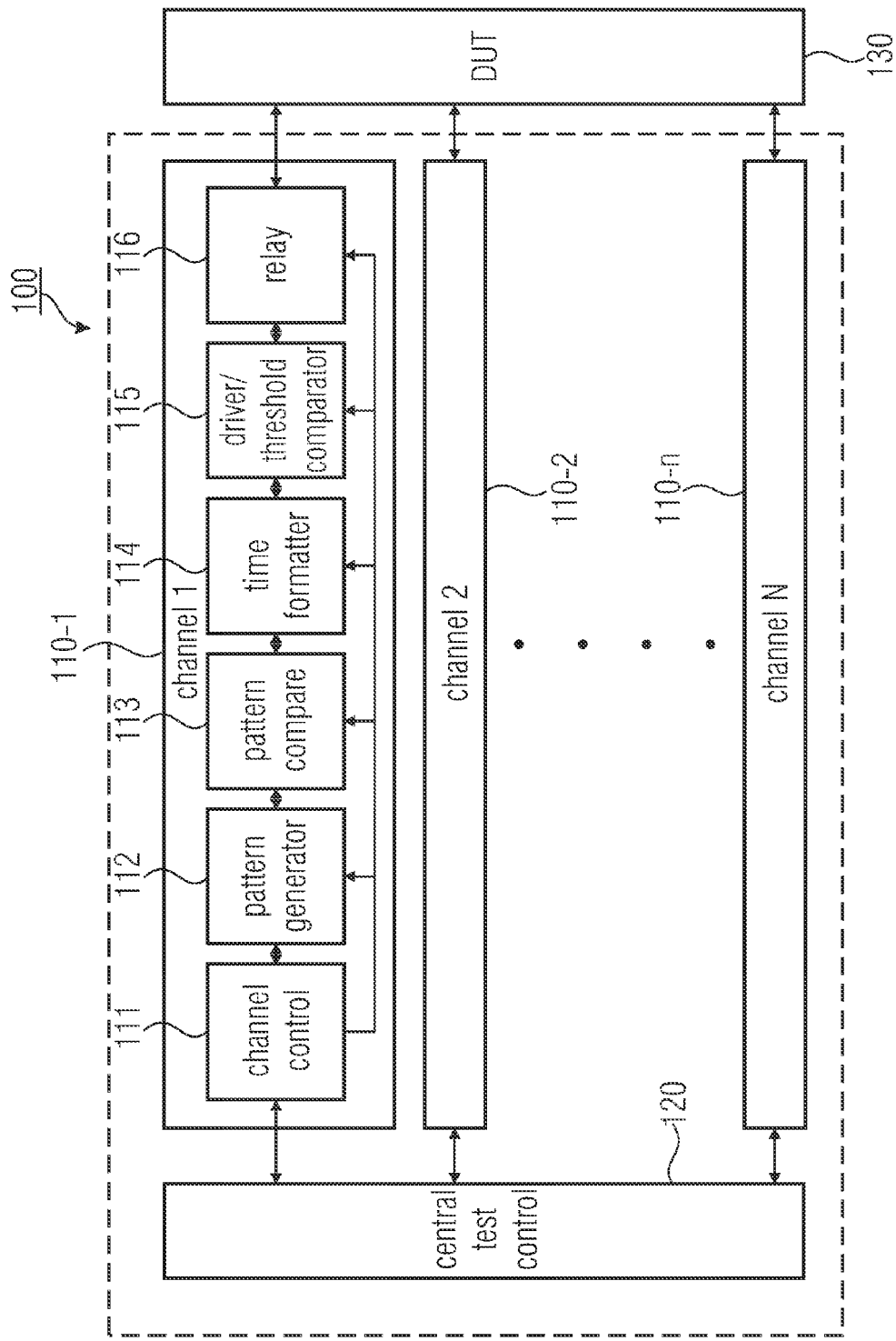
FIG. 1A illustrates an exemplary schematic block diagram of an automated test system in accordance with the prior art.
Figure 1B:
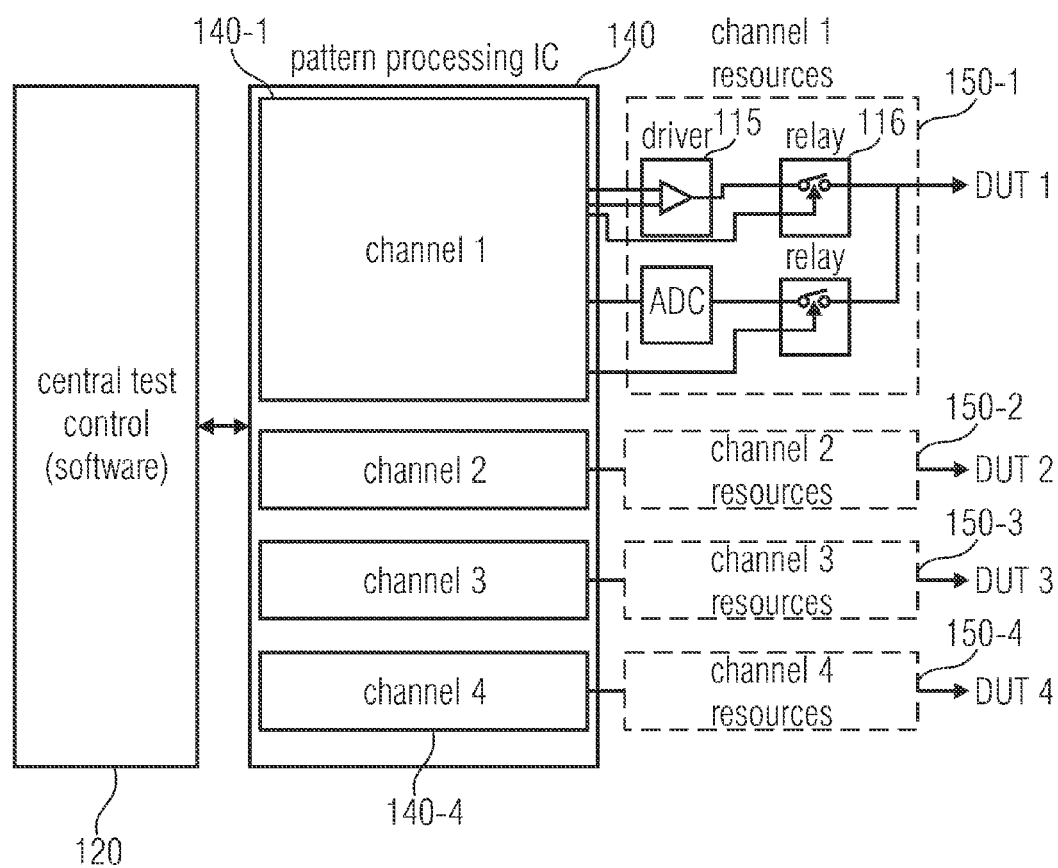
FIG. 1B illustrates a separation of the automated test equipment illustrated in FIG. 1A, into digital test channel integrated circuits and external analog hardware resources.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature:

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

The following description sets forth specific details such as particular embodiments, procedures, techniques, etc. for purposes of explanation and not limitation. It will be appreciated that other embodiments may be employed apart from these specific embodiments. For example, although the following description is facilitated using non-limiting exemplary applications, the technology may be employed to any type of ATE. In some instances, detailed descriptions of well-known methods, interfaces, circuits and devices are omitted so as to not obscure the description with unnecessary detail. Moreover, individual blocks are shown in some of the figures. The functions of those blocks may be implemented using individual hardware circuits, using software programs and data, in conjunction with a suitably programmed digital micro processor or general purpose computer, using application-specific integrated circuitry (ASIC) and/or using one or more digital signal processors (DSPs).

Embodiments of this present invention provide solutions to the increasing challenges inherent in test hardware resource management. Various embodiments of the present disclosure provide a method for integrating the use of hardware testing resources for more than one channel. As discussed in detail herein, with a plurality of exemplary test channel integrated circuits, different logical control commands from different test channel integrated circuits may be temporally scheduled such that the different test channel integrated circuits may subsequently access a single hardware resource in a multiplexing scheme, such as time division multiplexing.

Figure 2:
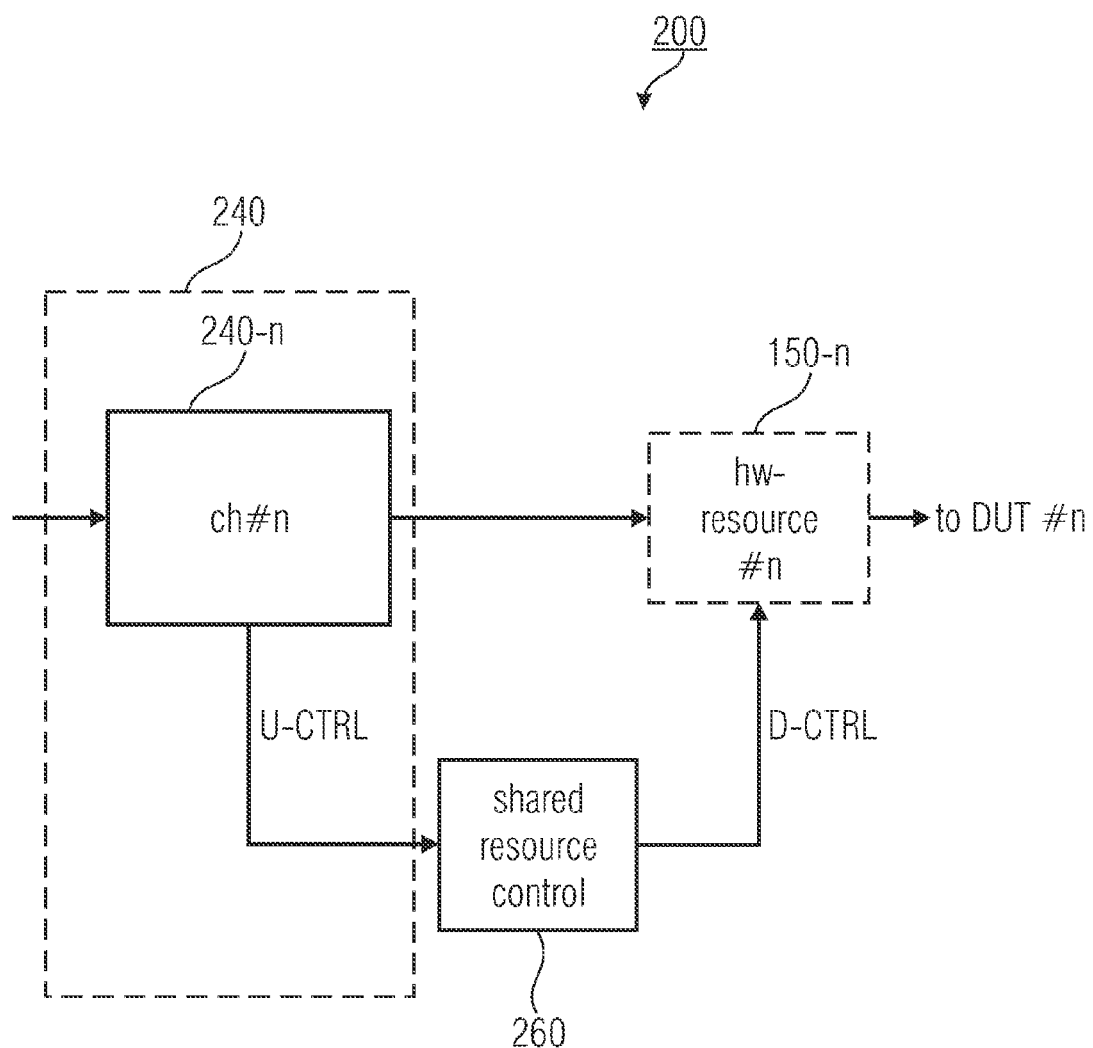
FIG. 2 illustrates an exemplary apparatus for testing a device-under-test, in accordance with an embodiment of the present invention.

FIG. 2 illustrates an exemplary block diagram of an apparatus 200 for testing a device-under-test according to an embodiment of the present invention. The apparatus 200, which may comprise an ATE, comprises a digital pattern processing or test channel IC 240-$n$ ($n=1, 2, \ldots, N$) adapted to communicate with an I/O pin of the DUT 130 by means of a (analog) hardware resource 150-$n$ ($n=1, 2, \ldots, N$). The test channel IC 240-$n$ ($n=1, 2, \ldots, N$) is coupled to a resource control means 260. The resource control means 260 receives from the test channel IC 240-$n$ ($n=1, 2, \ldots, N$) a logical control command U-CTRL describing a desired operation of the hardware resource 150-$n$ ($n=1, 2, \ldots, N$), wherein the resource control means 260 is adapted to convert the logical control command U-CTRL into a dedicated control command D-CTRL for the hardware resource 150-$n$ ($n=1, 2, \ldots, N$). The dedicated control command D-CTRL is adapted to an actual physical implementation of the hardware resource 150-$n$ ($n=1, 2, \ldots, N$).

The logical control command U-CTRL from the test channel IC 240-$n$ ($n=1, 2, \ldots, N$) is dependent on the genus or species of the hardware resource 150-$n$ ($n=1, 2, \ldots, N$), whether the hardware resource 150-$n$ ($n=1, 2, \ldots, N$) is, for example, a genus/species of an ADC, DAC, switch, or a voltage/current level driver, etc. On the other hand, the logical control command U-CTRL received from the test channel IC 240-$n$ ($n=1, 2, \ldots, N$) is independent from the actual physical implementation of the hardware resource 150-$n$ ($n=1, 2, \ldots, N$), such that it is independent from whether the hardware resource 150-$n$ ($n=1, 2, \ldots, N$) is, for example, an ADC-x or an ADC-y. This means that the logical control command U-CTRL is uniform for a certain genus of hardware resource and describes the desired operation of the hardware resource 150-$n$ ($n=1, 2, \ldots, N$) abstractly. For example, for a hardware resource genus "switch," the logical control command U-CTRL may be of an exemplary binary form "open" (switch) or "close" (switch), etc. For other hardware resource species, the respective logical control commands U-CTRL may similarly describe abstract hardware resource operations, like, for example, "sample" for a species ADC.

In one exemplary embodiment, the resource control means 260 may then translate the abstract logical control command U-CTRL into hardware-resource-specific dedicated control commands D-CTRL which specifically address, control, or program the external hardware resource 150-$n$ ($n=1, 2, \ldots, N$) in a manner appropriate to its specific physical implementation. This will be explained with reference to a hardware-resource genus "switch" illustrated in FIGS. 3A, 3B, and 3C.

Figure 3A:
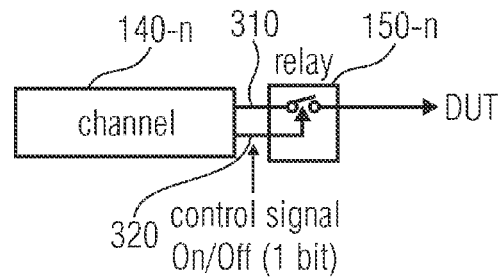
FIG. 3A illustrates an exemplary control of a relay as a hardware resource by a digital test channel in accordance with an embodiment of the present invention.

FIG. 3A illustrates a connection of an exemplary relay (e.g., an electrically operated switch) as a hardware resource 150-$n$ ($n=1, 2, \ldots, N$) connected between an exemplary test channel IC 140-$n$ ($n=1, 2, \ldots, N$) and an exemplary DUT 130. The test channel IC 140-$n$ ($n=1, 2, \ldots, N$) comprises a data line 310 for transmitting and/or receiving a test pattern to or from the DUT. Additionally, the test channel IC 140-n (n=1, 2, . . . , N) comprises a dedicated control signal line 320 for transmitting dedicated, hardware-specific control commands D-CTRL from the test channel IC 140-n (n=1, 2, . . . , N) to the relay 150-n (n=1, 2, . . . , N). For the relay 150-n (n=1, 2, . . . , N), the hardware-specific control commands D-CTRL may be simply On/Off, which may be coded using only a single bit ("1"/"0").

Figure 3B:
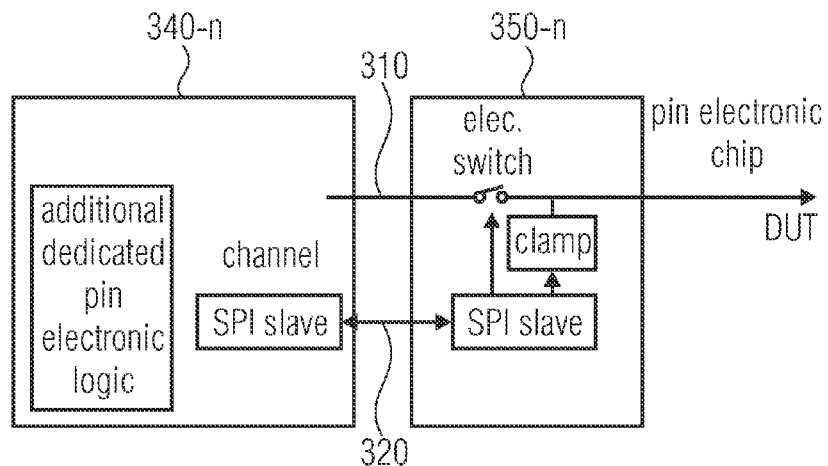
FIG. 3B schematically depicts an exemplary impact of a change of the hardware resource according to FIG. 3A in accordance with an embodiment of the present invention.

An alternative to the above-described relay 150-n (n=1, 2, . . . , N) may be an electronic switch 350-n (n=1, 2, . . . , N), as illustrated in FIG. 3B, that is integrated as a part of a pin on an electronic chip and can perform other measurement functions as well. Due to an exemplary silicon implementation of the switch 350-n (n=1, 2, . . . , N), special care is to be taken during the switching process. For example, in order to prevent electrical spikes while switching, there may be a need for a sequence of events (or dedicated hardware-specific control commands D-CTRL) that are followed when using the electronic switch 350-n (n=1, 2, . . . , N) instead of the relay 150-n (n=1, 2, . . . , N). A simple control command On/Off for the relay 150-n (n=1, 2, . . . , N) which can also be regarded as a logical control command for the relay/switch, may be translated into a sequence of dedicated control commands D-CTRL applicable to the electronic switch 350-n (n=1, 2, . . . , N), such as the following sequence: "turn on voltage clamping," "turn on switch," and then "release clamping." In a traditional ATE, as illustrated in FIG. 3A, the test channel IC 140-n (n=1, 2, . . . , N) may send a single bit, 0/1, corresponding to an Off/On command. The test channel IC 340-n (n=1, 2, . . . , N) needs to adapt to the protocol that is utilized by the pin electronics, for example an SPI (Serial Peripheral Interface Bus). Moreover, the channel IC 340-n (n=1, 2, . . . , N) has to follow a sequence of events for a safe switching that is utilized by the pin of the electronics chip 350-n (n=1, 2, . . . , N). Therefore, a dedicated pin to an electronic solution would have to be built within the channel IC 140-n (n=1, 2, . . . , N). However, modifying the test channel IC 140-n (n=1, 2, . . . , N), or, more specifically, the channel-specific channel control block 111 thereof, is an expensive and time consuming process. Also, the test software running on the central test control unit 120 would have to be adapted.

As illustrated in FIGS. 3A and 3B, each time external hardware resources are changed and, consequently, different handing methods used, the test channel IC 140-n (n=1, 2, . . . , N) would have to be re-adapted for the external hardware resource change. This can be avoided as described herein, and illustrated in FIG. 3C.

Figure 3C:
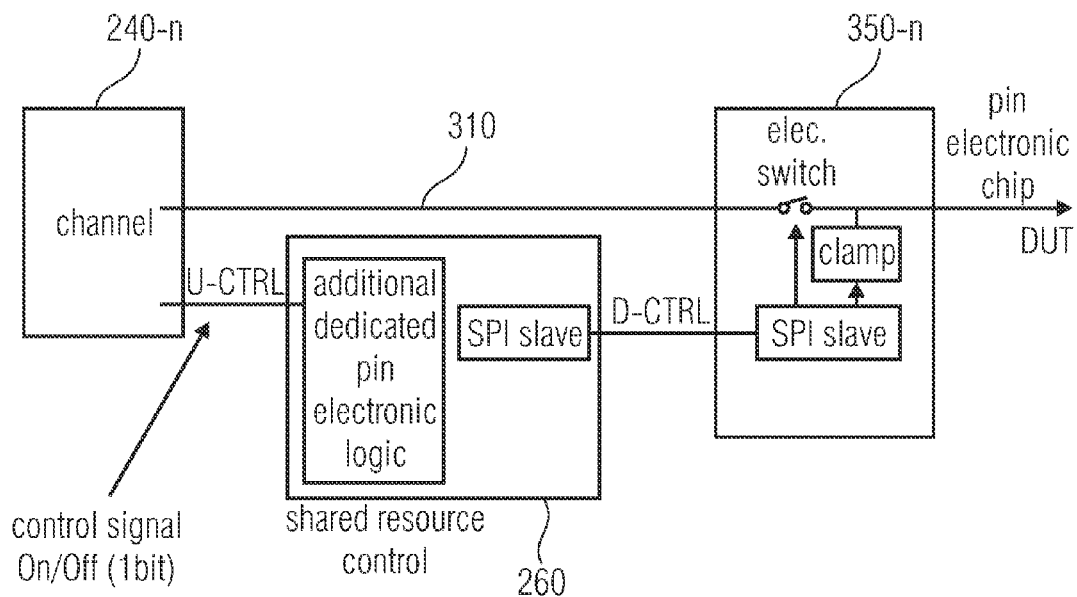
FIG. 3C illustrates an exemplary test channel integrated circuit coupled to a resource control means for a translation of logical channel control commands to dedicated channel control commands in accordance with an embodiment of the present invention.

In accordance with embodiments of the present invention, control commands may be separated between logical control commands U-CTRL, e.g. "1"/"0" or (On/Off), and dedicated control commands D-CTRL that may include a sequence of control events that are utilized by a new external resource 350-n (n=1, 2, . . . , N). As illustrated in FIG. 3C, a conversion from logical control commands U-CTRL to dedicated control commands D-CTRL may be handled by a resource control means 260. A test channel IC 240-n (n=1, 2, . . . , N) may keep a uniform control interface with the uniform logical control commands U-CTRL, even when the external resources are replaced and, hence, need to be handled differently. The resource control means 260 is, according to an embodiment of the present invention, adapted to translate the uniform logical control commands U-CTRL that come from the test pattern processing or test channel IC 240-n (n=1, 2, . . . , N), into the dedicated control commands D-CTRL, communication protocols, and/or sequence of events that are useful due to the physical implementation of the associated external hardware resource. This may allow a cost savings because the test channel IC 240-n (n=1, 2, . . . , N) does not have to be adapted each time that associated hardware resources for communicating with DUTs are changed. Hence development time may be saved.

Figure 4A:
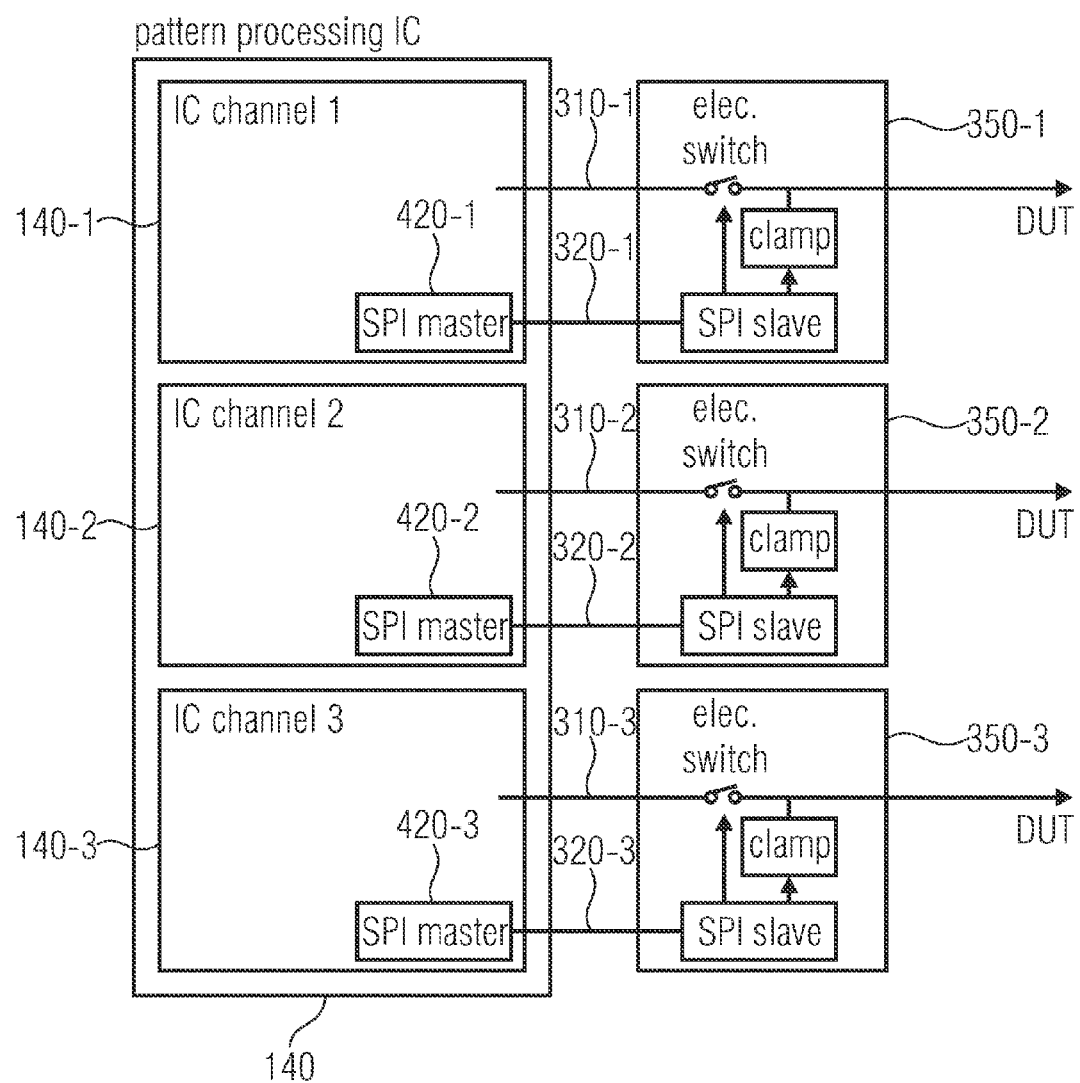
FIG. 4A illustrates an exemplary configuration of test channel integrated circuits communicating with dedicated hardware resources via channel specific communication ports in accordance with an embodiment of the present invention.
Figure 4B:
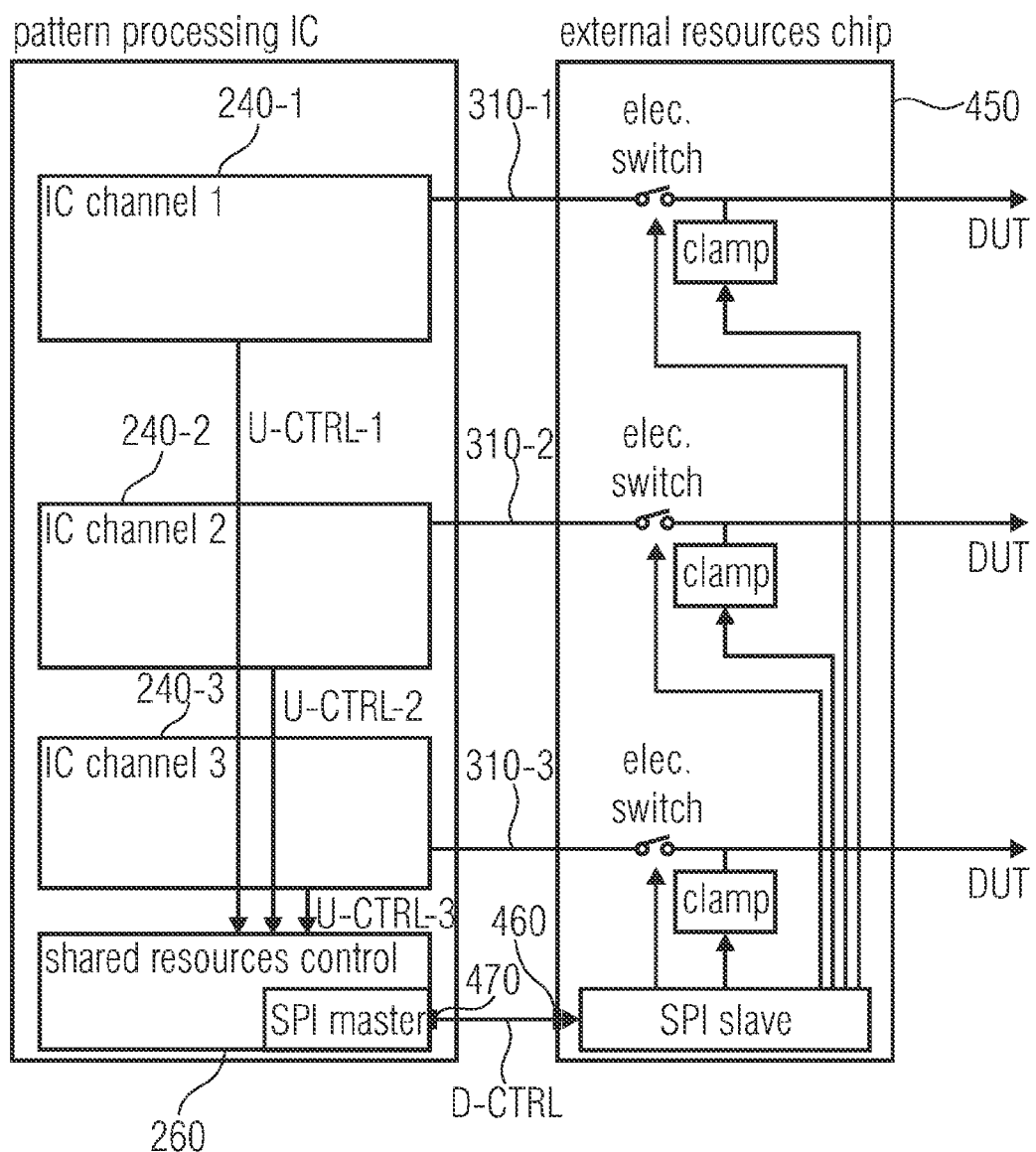
FIG. 4B schematically illustrates an exemplary usage of a shared resource control means communicating with a multi-channel hardware resource via a single communication port in accordance with an embodiment of the present invention.

A further embodiment of the present invention is illustrated in FIGS. 4A and 4B. FIG. 4A illustrates an exemplary conventional ATE-setup. Each test channel IC 140-n (n=1, 2, 3) may comprises its own control line 320-n (n=1, 2, 3) and its own transceiver 420-n (n=1, 2, 3) to external resources 350-n (n=1, 2, 3). For example, the dedicated control communication may be implemented according to a synchronous serial data link standard such as an exemplary serial peripheral interface bus (SPI).

For some test scenarios, individual channel-specific hardware resources 350-n (n=1, 2, 3) could be replaced by an exemplary hardware resource having a so-called multi-channel port. An example could be a two-channel driver as a single chip with only a single control port according to SPI. A similar scenario is illustrated in FIG. 4B.

FIG. 4B illustrates an exemplary external multi-channel hardware resource chip 450 comprising a plurality of test pattern data ports for a plurality of test pattern data lines 310-n (n=1, 2, 3) from a plurality of specific test channel ICs 240-n (n=1, 2, 3). However, the multi-channel hardware resource 450 only comprises a single control port 460 for receiving dedicated control commands D-CTRL from the test channel IC 240 (comprising the individual test channel ICs 240-n (n=1, 2, 3). As illustrated in FIG. 4B, the resource control means 260 is shared by the plurality of the individual test channel ICs 240-n (n=1, 2, 3) and is operable to multiplex different logical control commands U-CTRL-n (n=1, 2, 3) from the different individual test channel integrated circuits 240-n (n=1, 2, 3) to a single control data port 470 of the shared resource control means 260, which may be coupled to the multi-channel control port 460 of the multi-channel hardware resource 450. In other words, the resource control means 260, which is a shared resource control means between the different test channel ICs 240-n (n=1, 2, 3), receives individual logical control commands U-CTRL-n (n=1, 2, 3) from the individual test channel IC's 240-n (n=1, 2, 3), respectively, and converts the received individual logical control commands into multiplexed dedicated control commands D-CTRL. The multiplexing may be done on the test channel IC 240 such that the multiplexed dedicated control commands are communicated via the single control data port 470 to the external multi-channel hardware resource 450. As illustrated in FIG. 4A, this may save I/O pins on both ends and does not require multiple transceivers (SPI master/slave).

Figure 5A:
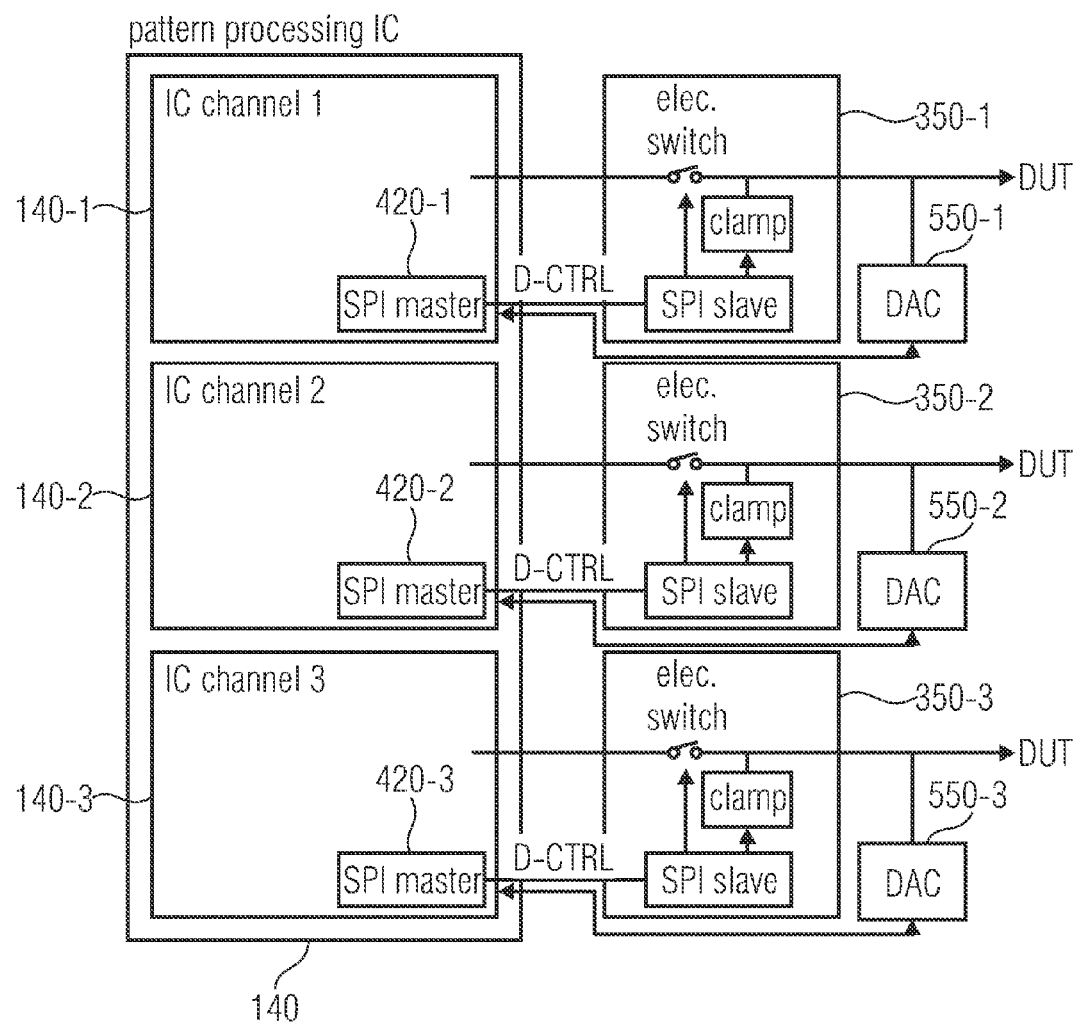
FIG. 5A schematically illustrates an exemplary setup of various tests channels using dedicated hardware resources, respectively in accordance with an embodiment of the present invention.
Figure 5B:
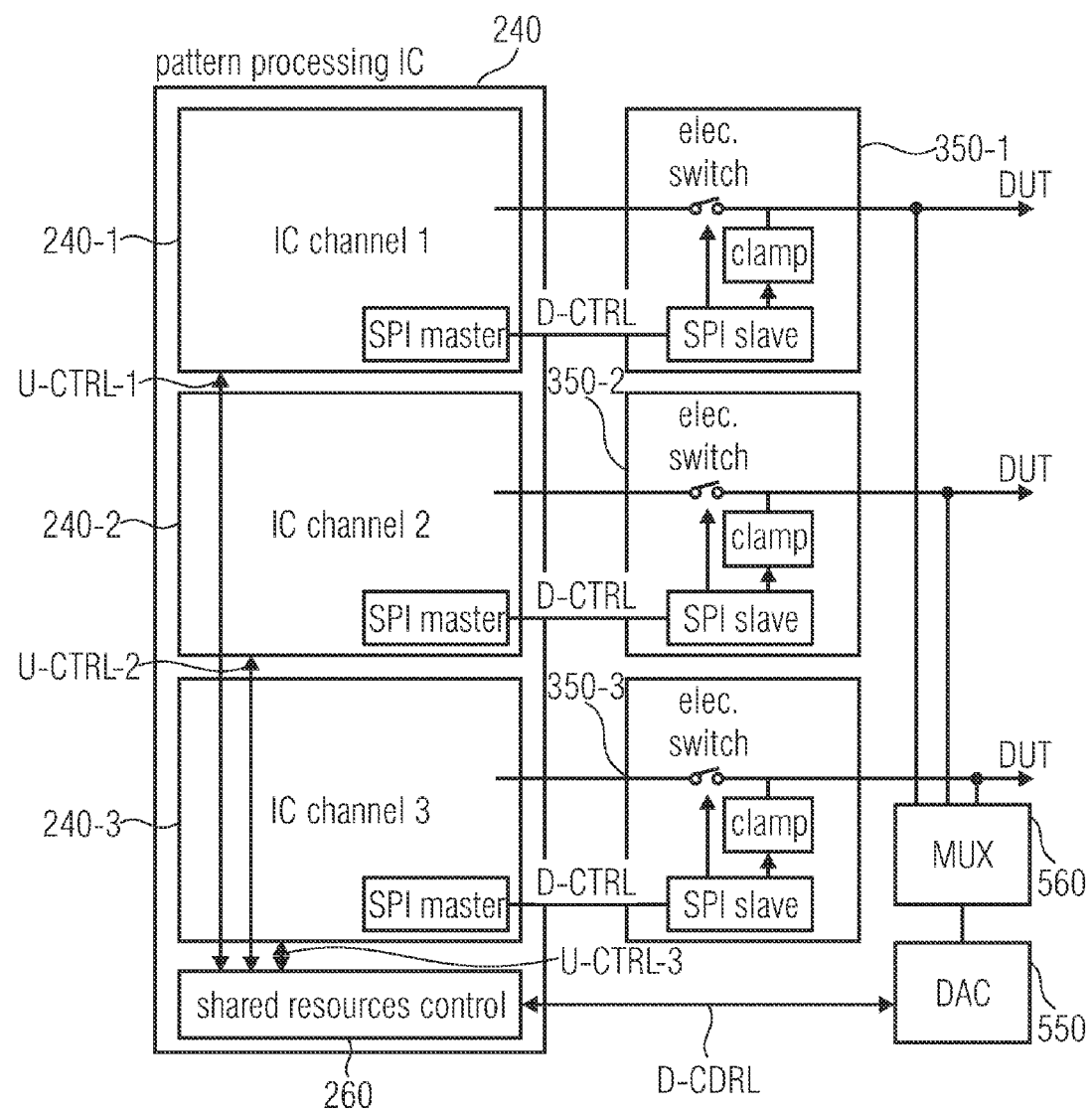
FIG. 5B illustrates an exemplary concept of a shared resource control means communicating with a single hardware resource used for a plurality of test channels in a multiplex scheme, in accordance with an embodiment of the present invention.

A third exemplary embodiment of the present invention is illustrated in FIGS. 5A and 5B. FIG. 5A illustrates an exemplary ATE setup that comprises a pattern processing test channel IC 140 with a plurality of individual test channel ICs 140-n (n=1, 2, 3) in communication with external hardware resources 350-n, 550-n (n=1, 2, 3), respectively. For communication with both external hardware resources 350-n, 550-n (n=1, 2, 3), the individual test channel ICs 140-n (n=1, 2, 3) may transmit dedicated control commands D-CTRL to both external hardware resources 350-n, 550-n (n=1, 2, 3), respectively. As illustrated in FIG. 5A, each individual conventional test channel IC 140-n (n=1, 2, 3) may configure its own DAC 550-n (n=1, 2, 3).

However, when different test channel ICs 140-n (n=1, 2, 3) do not need to access their associated DACs 550-n (n=1, 2, 3) temporally in parallel, the setup illustrated in FIG. 5A may be simplified with respect to the communication port and a hardware resource count by applying further embodiments of the present invention. Should individual test channel ICs 140-n (n=1, 2, 3) subsequently access the individual DACs 550-n (n=1, 2, 3), the embodiment illustrated in FIG. 5B allows a significant reduction of external hardware resources.

As illustrated in FIG. 5B, only one common general hardware resource 550 (for example a DAC) may be used for the plurality of individual test channel ICs 240-n (n=1, 2, 3). The common general resource 550 is not a physical part of the individual test channels, however. The common general resource 550 is seen "virtually" by each test channel as a dedicated hardware resource even though physically only a single or at most only a few instances of the common general resources 550 exist. This shared hardware resource 550 is controlled by the shared resources control means 260, which can prioritize the usage control between the individual test channels or test channel ICs 240-n (n=1, 2, 3). In one embodiment the shared resource control means 260 is adapted to temporally schedule different logical control commands U-CTRL-n (n=1, 2, 3) from the different test channel ICs 240-n (n=1, 2, 3), such that the different channel test channel ICs 240-n (n=1, 2, 3) may subsequently access the single external hardware resource 550 according to a multiplexing scheme. In one embodiment, a multiplexing scheme may be a time division multiple access (TDMA) scheme. In one exemplary embodiment, the shared resources control means 260 receives the logical control commands U-CTRL-n (n=1, 2, 3) from the plurality of test channel ICs 240-n (n=1, 2, 3) and schedules their conversion to dedicated control commands D-CTRL for the common hardware resource 550. If, for example, test channel IC 240-1 wants to access the hardware resource (e.g., DAC) 550 temporally before test channel IC 240-2, the shared resources control means 260 schedules the respective translated dedicated control commands D-CTRL accordingly. That is, first, dedicated control commands D-CTRL-1 corresponding to logical control commands U-CTRL-1 of the test channel IC 240-1 are communicated to the DAC 550 together with a MUX-control signal for controlling a multiplexer 560, such that the DAC 550 operates according to the needs of test channel 1. Subsequently, dedicated control commands D-CTRL-2 corresponding to logical control commands U-CTRL-1 of the test channel IC 240-2 are communicated to the common DAC 550 together with the MUX-control signal for controlling the multiplexer 560.

According to an embodiment illustrated in FIG. 5B, each test channel n (n=1, 2, 3) sees the common DAC 550 and may configure it as illustrated in FIG. 5A. Test software that already exists may also be kept. In fact, there is only a single DAC 550 that is shared between the different test channels n (n=1, 2, 3). The shared resources control block 260 reacts to each channel-specific logical DAC control command and decides which channel to physically connect to the common DAC 550 by means of the external multiplexer 560. For some tests, the shared resources control block 260 allows each channel to access the DAC 550 in a time-sharing manner. For other tests, however, sometimes there is only one DAC 550 involved in the setup and the shared resources control means 260 allows that DAC 550 to be connected to the test channel in an automatic way without doing anything specific for that test channel.

The ATE setup illustrated in FIG. 5B may save external resources, costs, electrical power, and space on printed circuit boards (PCBs). The external resource 550 is no longer dedicated to a single test channel. In this example only a single DAC serves multiple test channels, while the shared resources control means 260 schedules and multiplexes the single DAC to the appropriate test channel.

Figure 6:
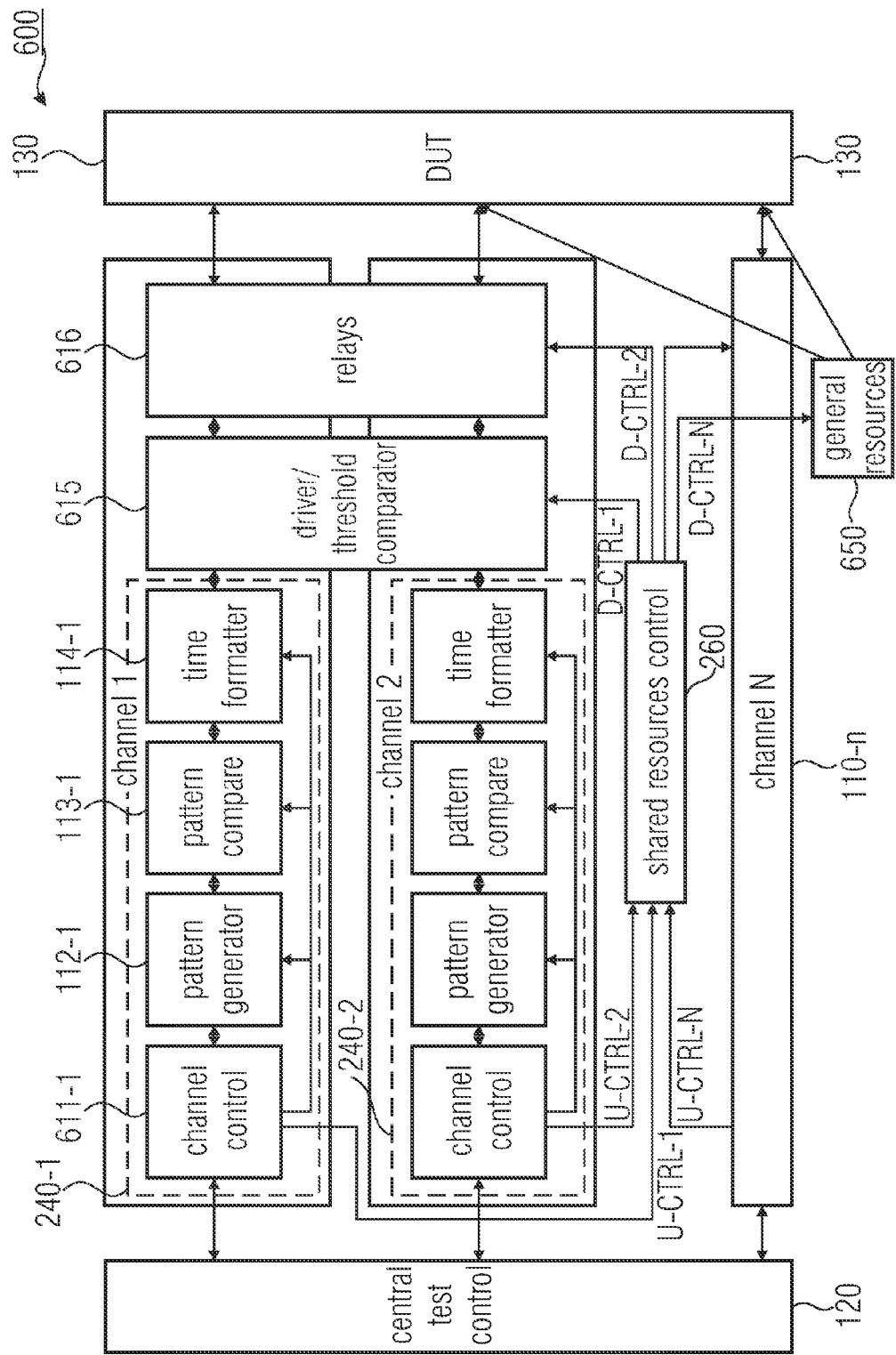
FIG. 6 schematically illustrates an exemplary block diagram of an automated test equipment in accordance with an embodiment of the present invention.

FIG. 6 illustrates an exemplary ATE 600 with a shared resources control block 260. The shared resources control block 260 is coupled to a channel control instance 611 of each individual test channel IC 140-n (n=1, 2, . . . , N). As illustrated in FIG. 6, the common shared resources control block 260 is fed from each individual test channel IC 140-n (n=1, 2, . . . , N) and is seen by each test channel as a dedicated channel resource block. The shared resources control block 260 is operable to receive uniform channel commands U-CTRL from the respective channel specific control blocks 611-n (n=1, 2, . . . , N) and to generate appropriate signals, communication protocols, and sequences of control events that are utilized by the external channel resources 615, 616.

Some of the external hardware resources may have multichannel ports, such as, for example, two-channel drivers on a single chip with a single control port, such as an SPI. In this case the shared resources control means 260 can multiplex logical control commands U-CTRL from a plurality of test channel ICs 140-n (n=1, 2, . . . , N) and translate them to a desired single resource communication protocol, as described herein, and illustrated in FIG. 4B.

Common general resources 650 that are not part of a test channel may be seen "virtually" by each test channel IC 140-n (n=1, 2, . . . , N) as a dedicated resource. However, physically, only a single or at most a few instances of it actually exists. This common general resource 650 may be controlled by the shared resources control means 260 which can prioritize the usage control between the different test channels. Therefore, a plurality of test channels may have access to a single A/D or D/A converter, as discussed herein, and illustrated in FIG. 5B.

Figure 7:
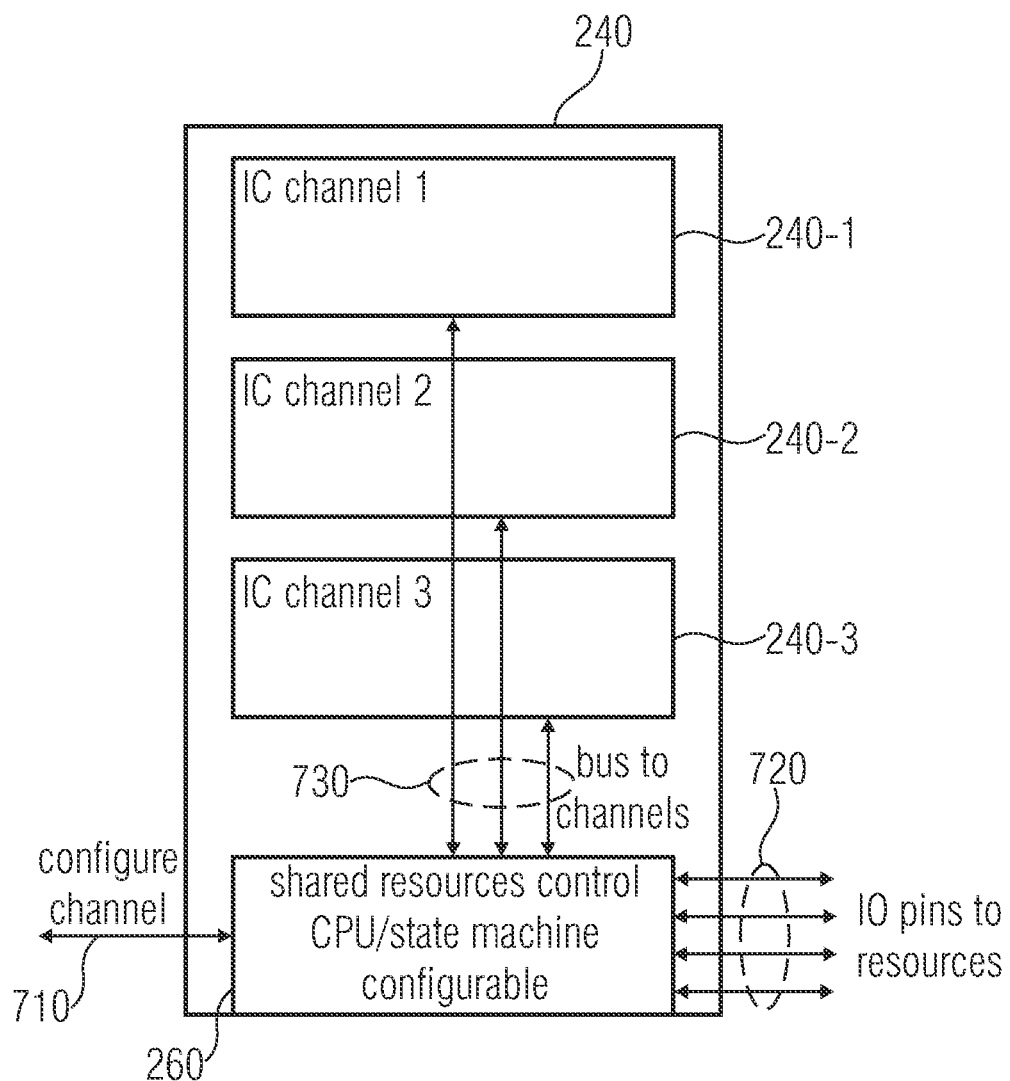
FIG. 7 illustrates exemplary connections of a shared resource control means in accordance with an embodiment of the present invention.

Referring now to FIG. 7, a (shared) resource control means 260 may be realized in the form of an exemplary microprocessor, which may be located within a housing of a main test channel IC 240 comprising the individual test channel ICs 240-n (n=1, 2, . . . , N). However, the resource control means 260 may also be located physically outside the housing of the test channel IC 240. The resource control means 260 may be implemented as software running on the microprocessor. Another method of implementation is dedicated hardware, such as an ASIC or a software state machine. As illustrated, the (shared) resource control means 260 comprises various connections or interfaces, such as a configuration channel 710, connections 720 to external general purpose I/O pins which can interface to various external hardware resources, and connections 730 to the individual test channel ICs 240-n (n=1, 2, . . . , N) using a unified protocol, e.g., logical control commands (U-CTRL).

Although some aspects of the present invention have been described in the context of an apparatus, it is clear that these aspects also represent a description of the corresponding method, where a block or a device may correspond to a method step or a feature of a method step. Analogously, aspects described in the context of a method step also represent a description of a corresponding block or item or feature of a corresponding apparatus.

Depending on the circumstances, the methods and apparatuses described herein may be implemented in hardware or software. The implementation may be done on a digital storage medium, particularly a disk, CD or DVD with electronically readable control signals, which may cooperate with a programmable computer system, such that the method for testing a DUT is executed. In general, exemplary embodiments of the present invention may also consist of a computer program product with a program code stored on a machine-readable carrier for performing the exemplary method when the computer program product runs on a computer. In other words, exemplary embodiments of the present invention may be realized as a computer program with a program code for performing a method for testing a DUT when the computer program runs on a computer or a digital signal processor.

As described herein, embodiments of the present invention allow the integration of modern hardware resources for more than one channel, e.g. so-called multi-channel hardware resources, with only a single control port or channel, while saving control signals, space, power and cost. Therefore, embodiments of the present invention may allow the use of a single general hardware resource with a plurality of test channels. In other words, while this hardware resource exists "virtually" for each test channel, there is still only one physical instance of the hardware resource. This enables test system flexibility and reduced system and component costs.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. An apparatus for testing a device, the apparatus comprising:
    a test channel circuit operable to communicate with an input/output pin of the device using a hardware resource; and
    a resource controller coupled to the test channel circuit and configured to receive a logical control command describing a requested operation of the hardware resource, wherein the resource controller is configured to convert the logical control command into a dedicated control command for the hardware resource, and wherein further the dedicated control command is configured to be received by a physical implementation of the hardware resource.

2. The apparatus according to claim 1, wherein the logical control command is generated by the test channel circuit and is independent from the physical implementation of the hardware resource.

3. The apparatus according to claim 1, wherein the test channel circuit comprises:
    a digital test pattern generator configured for generating a digital test pattern; and
    a time formatter configured for associating a timing to binary values of the digital test pattern.

4. The apparatus according to claim 1, wherein the test channel circuit comprises:
    a digital test pattern comparator configured for comparing a test pattern received from the input/output pin with an expected digital test pattern.

5. The apparatus according to claim 1, wherein the hardware resource is disposed external to the test channel circuit, and wherein further the hardware resource is configured to couple the test channel circuit to the device.

6. The apparatus according to claim 1, wherein the hardware resource is operable to convert a signal or a test pattern to or from the device into a signal suited for one of the input/output pin and the test channel circuit.

7. The apparatus according to claim 1 further comprising:
    a plurality of test channel circuits, wherein the resource controller is shared by the plurality of test channel circuits and is configured to multiplex different logical control commands from different test channel circuits to a single control data port which is coupled to a multi-channel port of a multi-channel hardware resource.

8. The apparatus according to claim 1 further comprising:
    a plurality of test channel circuits, wherein the resource controller is adapted to temporally schedule different logical control commands from different test channel circuits, and wherein the different test channel circuits are configured to subsequently access a single hardware resource in a time division multiplexing scheme.

9. The apparatus according to claim 1, wherein the resource controller is re-configurable for adapting the resource controller to a physical implementation of a physically connected hardware resource.

10. A non-transitory computer-readable medium having computer-readable program code embodied therein for causing a computer system to perform a method of testing, said method comprising:
    receiving a logical control command from a test channel circuit dedicated to communicate with an input/output pin of a device under test using a hardware resource, wherein the logical control command describes a requested operation of the hardware resource; and
    converting the logical control command into a dedicated control command for the hardware resource, wherein the dedicated control command is configured to be received by a physical implementation of the hardware resource.

11. The computer-readable medium of claim 10, wherein the logical control command is generated by the test channel circuit and is independent from the physical implementation of the hardware resource.

12. The computer-readable medium of claim 10, wherein the hardware resource is disposed external to the test channel circuit, and wherein further the hardware resource is configured to connect the test channel circuit to the device.

13. The computer-readable medium of claim 10, wherein the hardware resource is configured to convert a signal or a test pattern to or from the device into a signal suited for one of the input/output pin and the test channel circuit.

14. The computer-readable medium of claim 10, wherein the method further comprises:
    receiving a plurality of logical control commands from a plurality of test channel circuits;
    sharing the resource controller by the plurality of test channel circuits; and
    multiplexing different logical control commands from different test channel circuits to a single control data port which is coupled to a multi-channel port of a multi-channel hardware resource.

15. The computer-readable medium of claim 10, wherein the method further comprises:
    receiving a plurality of logical control commands from a plurality of test channel circuits; and
    scheduling, using the resource controller, different logical control commands from different test channel circuits, and wherein the different test channel circuits subsequently access a single hardware resource in a time division multiplexing scheme.

16. The computer-readable medium of claim 10, wherein the resource controller is re-configurable for adapting the resource controller to a physical implementation of a physically connected hardware resource.

17. A system comprising a processor and a memory, wherein the memory comprises instructions that when executed by the processor implement a method of testing, the method comprising:
    receiving, from a test channel circuit dedicated to communicate with an input/output pin of the device using a hardware resource, wherein a logical control command describes a desired operation of the hardware resource; and converting the logical control command into a dedicated control command for the hardware resource, wherein the dedicated control command is configured to be received by a physical implementation of the hardware resource.

* * * * *